United States Patent [19]
Reis et al.

[11] Patent Number: 5,877,875
[45] Date of Patent: Mar. 2, 1999

[54] REFERENCE BEAM AUTO-FOCUS APPARATUS FOR MODULARIZED VOLUME-HOLOGRAPHIC MEMORY

[75] Inventors: James J. Reis, San Pedro; Richard L. Davis, Redondo Beach; Harold M. Stoll, Rancho Palos Verdes, all of Calif.

[73] Assignee: Northrop Grumman Corporation, Los Angeles, Calif.

[21] Appl. No.: 863,638

[22] Filed: May 28, 1997

Related U.S. Application Data

[63] Continuation of Ser. No. 420,531, Apr. 12, 1995, abandoned.

[51] Int. Cl.$^6$ .............................. G03H 1/26; G11C 13/04
[52] U.S. Cl. ........................... 359/22; 359/501; 365/125; 369/103
[58] Field of Search .................................. 359/22, 24, 36, 359/501; 365/124, 125, 216; 369/103

[56] References Cited

U.S. PATENT DOCUMENTS

| | | | |
|---|---|---|---|
| 3,703,328 | 11/1972 | Glass et al. ............................... | 365/125 |
| 3,782,802 | 1/1974 | Micheron et al. ......................... | 359/24 |
| 3,826,556 | 7/1974 | Graf ............................................ | 359/34 |
| 3,978,421 | 8/1976 | Puech ......................................... | 359/22 |
| 4,449,785 | 5/1984 | Huignard et al. ......................... | 359/24 |
| 5,128,693 | 7/1992 | Tatemichi et al. ........................ | 359/22 |
| 5,432,867 | 7/1995 | Mok ........................................... | 365/125 |

OTHER PUBLICATIONS

McManus et al, United States Statutory Invention Registration No. H738, Feb. 6, 1990.

"Multiple Storage and Erasure of Fixed Holograms in Fe–Doped LiNbO$_3$", *Applied Physics Letters*, vol. 26, No. 4, p. 182 (1975).

"Storage of 500 High–Resolution Holograms in a LiNO$_3$ Crystal", *Optics Letters*, vol. 16, No. 8, p. 605 (1991).

"Theory of Optical Information Storage in Solids", *Applied Optics*, vol. 2, No. 4, p. 393 (1963).

"Self Enhancement in Lithium Niobate", *Optics Communications*, vol. 72, No. 3, 4, p. 175 (1989).

"Single–Step Copying Process for Multiplexed Volume Holograms", *Optics Letters*, vol. 17, No. 9, p. 676 (1992).

*Primary Examiner*—Jon Henry
*Attorney, Agent, or Firm*—Terry J. Anderson; Karl J. Hoch, Jr.

[57] ABSTRACT

In a method for addressing holograms stored in a plurality of separate storage media, a reference beam is directed to a selected one of the plurality of storage media, the reference beam is then focused so as to obtain a substantially flat wavefront within a reference beam plane of the selected storage medium, and the angle of the reference beam is then varied so as to select a hologram stored therein.

8 Claims, 2 Drawing Sheets

REFERENCE BEAM AUTO-FOCUS APPARATUS FOR MODULARIZED VOLUME-HOLOGRAPHIC MEMORY

This application is a continuation of application Ser. No. 08/420,531 filed on Apr. 12, 1995 now abandoned.

FIELD OF THE INVENTION

The present invention relates generally to holographic storage devices and more particularly to a method for addressing holograms stored in a plurality of separate storage media by directing a reference beam to a selected one of the storage media, focusing the reference beam so as to obtain a substantially flat wavefront within a reference beam plane of the selected storage medium, and varying the angle of the reference beam so as to address a selected hologram stored therein, the selected hologram being readout as a result of such addressing.

BACKGROUND OF THE INVENTION

Holographic techniques for storing images are well known. Such techniques are commonly used to store images of three dimensional objects in a wide variety of different applications. Additionally, various methodologies for utilizing such holographic techniques to store digital data for use in computer systems are currently being explored.

The technique for forming holograms comprises splitting the highly coherent output beam of a laser into separate reference and object beams. The reference beam is directed onto the holographic storage medium, e.g., a photorefractive material, while the object beam is directed onto the object whose image is to be stored. Light reflected from the object is directed to the photorefractive material wherein an interference pattern is formed via interference of the reference beam with the reflected light of the object beam. In the case of digital data storage, the object beam may pass through an optical modulator rather than being reflected off the object whose image is to be stored.

Subsequently, directing a reference beam onto the holographic storage medium results in the reconstruction of an image representative of the originally illuminated object or digital data.

Also known are techniques for storing a plurality of such images within a single photorefractive medium via angle-multiplexing of the images. Such angle-multiplexing is discussed in "THEORY OF OPTICAL INFORMATION STORAGE IN SOLIDS," *Applied Optics*, Vol. 2, No. 4, p. 393 (1963). The method of angle-multiplexing generally involves maintaining a constant angle for the object beam, while varying the angle of the reference beam for each exposure. Anglemultiplexing thus allows a large number of holographic images to be stored within a common volume of photorefractive medium, thereby greatly enhancing the storage density thereof.

In order to provide increased total storage capacity, it is, in general, desirable to utilize multiple holographic storage modules, wherein each storage module comprises a separate storage medium. The use of such multiple storage modules, however, presents technical problems which must be overcome in order to make such construction feasible. One problem commonly associated with the use of multiple storage modules is the ability to quickly and accurately address the desired hologram stored within the storage medium of a selected storage module. Not only must the reference beam be directed to the selected storage medium, but the reference beam must be directed thereto in a manner which provides a sufficiently flat wavefront within the reference beam plane of the selected storage medium to avoid inadvertent, partial recall of other holograms stored within said storage medium.

The degree of flatness required is determined by the angular separation between adjacent multiplexed holograms as discussed in detail below.

As such, it is desirable to provide a means for addressing a plurality of different storage modules and means for adjusting the wavefront flatness of the addressing reference beam, preferably automatically, each time a different storage module is addressed.

SUMMARY OF THE INVENTION

The present invention specifically addresses and alleviates the above-mentioned deficiencies with the prior art. More particularly, the present invention comprises a method for addressing holograms stored in a plurality of distinct storage media. The method comprises the steps of directing a reference beam to a selected one of a plurality of storage media, focusing the reference beam so as to obtain a sufficiently flat wavefront within a reference beam plane of the selected storage medium, and varying the angle of the reference beam so as to address a selected hologram stored therein. The selected hologram is read-out as a result of such addressing.

Preferably, the reference beam is focused via a lens disposed upon a translation stage. Preferably, the hologram being read-out or reconstructed object beam, is monitored and servo control is utilized so as to effect such focusing of the reference beam via the translation stage.

Optionally, data specifying the position of the translation stage for each different storage medium is stored in a memory. Reading the stored data and moving the translation stage to the indicated position results in at least coarse focusing of the reference beam for that particular storage medium.

The reference beam is preferably directed to a selected one of the plurality of different storage media by aligning the polarization of the reference beam such that the reference beam is reflected by a polarizing beam splitter toward the selected storage medium. The reference beam is otherwise transmitted by the beam splitter, such as when a different storage medium is selected.

These, as well as other advantages of the present invention will be more apparent from the following description and drawings. It is understood that changes in the specific structure shown and described may within the scope of the claims without departing from the spirit of the invention.

DETAILED DESCRIPTION OF THE PREFERRED EMBODIMENT

The detailed description set forth below in connection with the appended drawings is intended as a description of the presently preferred embodiment of the invention, and is not intended to represent the only form in which the present invention may be constructed or utilized. The description sets forth the functions and sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

The present invention provides a means for generating a well-collimated laser reference beam within any one of N (an integer) holographic storage modules. Together, the N modules comprise a larger holographic memory. Precise and real-time adjustment of reference beam collimation is provided so as to achieve physical interchangability of the N modules.

Figure 1:
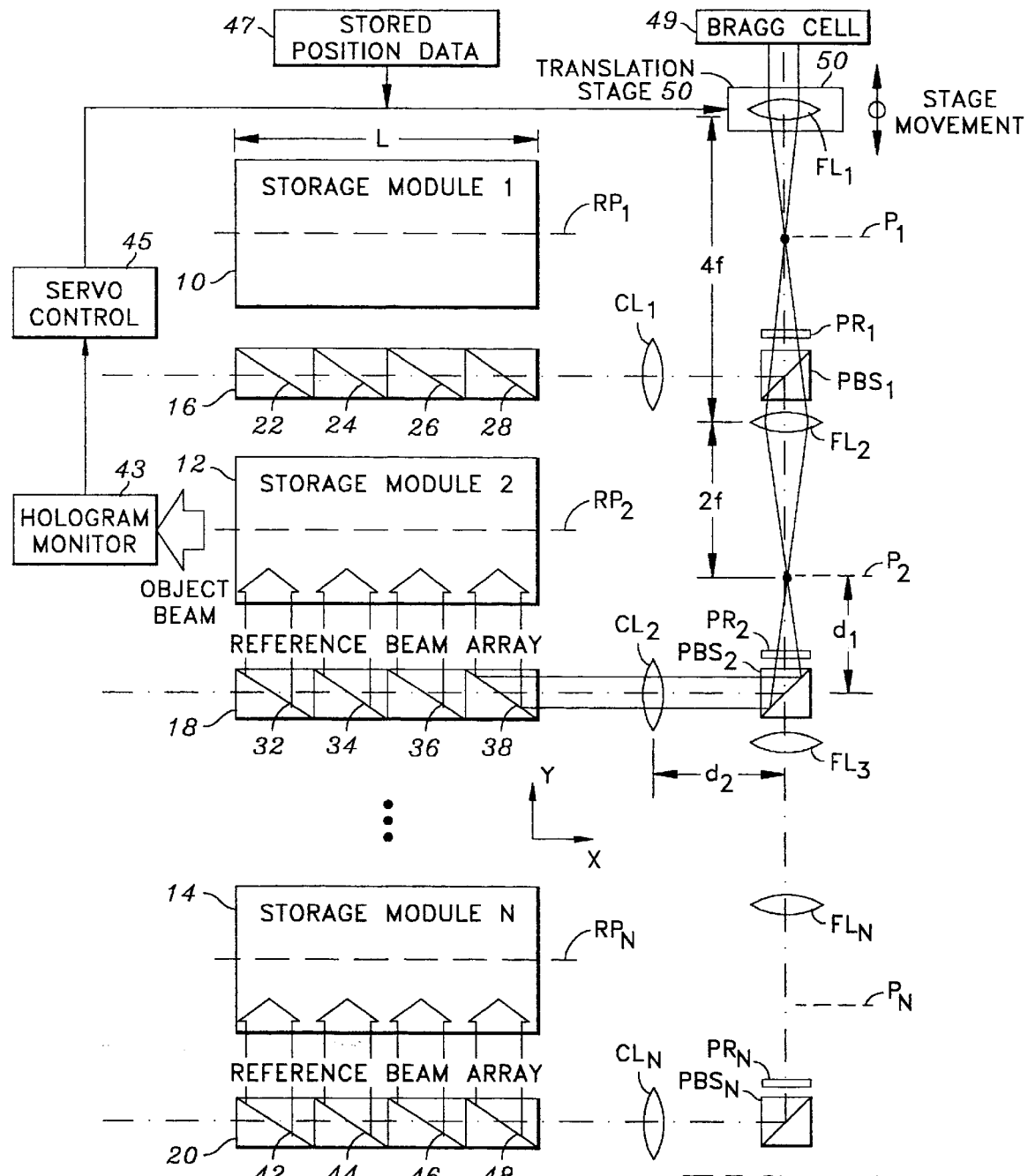
FIG. 1 is a schematic representation of a modularized volume-holographic memory comprising a plurality of different storage media as well as the optical system for effecting auto-focus and addressing of selected holograms stored within selected storage media.
Figure 2:
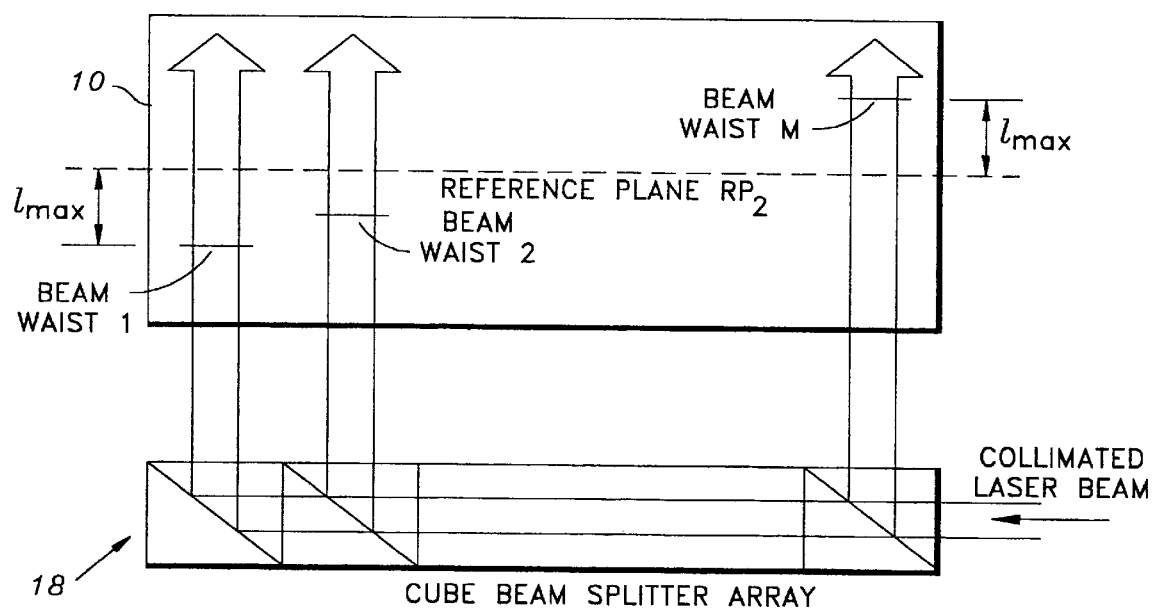
FIG. 2 is a schematic representation of a single storage medium showing the formation of beam waists associated with each of the reference beams reflected into the storage media via a cube beam splitter array.

The reference beam auto-focus apparatus for a modularized volume-holographic memory of the present invention is illustrated in FIGS. 1 and 2, which depict a presently preferred embodiment of the invention.

Referring now to FIG. 1, the present invention is comprised generally of a plurality of different storage media or modules such as 10, 12, and 14. As shown, the separate storage media 10, 12, 14 are spaced apart from one another. Reference beam optics direct a reference beam to a selected one of the storage media, focus the reference beam so as to obtain a maximally flat wave front within a reference beam plane of the selected storage medium, and vary the angle of the reference beam so as to address a desired hologram stored therein. Thus, the selected hologram is read-out as a result of such addressing.

More particularly, the focusing lens $FL_1$ is disposed upon translation stage 50 such that movement of translation stage 50 back and forth in the indicated direction, i.e., along the optical axis of focusing lens $FL_1$, effects focusing of the reference beam so as to obtain a substantially flat wave front within a reference beam plane of the selected storage medium.

Means for effecting angular positioning of the reference beam relative to the optical axis of $FL_1$ are preferably disposed prior to $FL_1$ within the optical path of the reference beam. Those skilled in the art will recognize that various such means are suitable for effecting angular positioning of the reference beam. An acousto-optic Bragg cell 49 as shown is one example of such an angular positioning means.

Focusing lens $FL_1$ focuses the collimated laser reference beam, nominally to a point, at $P_1$, from which the reference beam is directed through first polarization rotator $PR_1$. The polarization rotator $PR_1$ may, for example, comprise a liquid crystal material capable of rotating the polarization plane of the reference signal in response to an electrical input.

After passing through the polarization rotator $PR_1$ the reference beam is incident upon polarizing beam splitter $PBS_1$.

The combination of the polarization rotator $PR_1$ and the polarizing beam splitter $PBS_1$ define a switch for directing the reference beam either toward the first storage module 10 or alternatively on to other such polarization rotator/ polarizing beam splitter pairs which can similarly be switched so as to direct the reference beam to a desired storage module.

Any hologram within any one of the N holographic storage modules of the memory of FIG. 1 can be precisely addressed by translating focusing lens $FL_1$ in the $\pm Y$ direction. Holographic storage module "n" (n=1, 2, . . . , N) is precisely addressed when the reference beam wavefront is flat, to within a certain tolerance to be specified, within reference beam plane $RP_n$ of the selected module. The degree of flatness (in optical wavelengths) is determined by the angular separation between multiplexed holograms. For example, if the length of a module is L, as shown in FIG. 1, the optical wave length is $\lambda$, and the angular separation between muliplexed holograms is defined as $\Delta\phi$, then the flatness tolerance is:

$\Delta f = (L/\lambda) \tan (\Delta\phi)$.

For L=3 cm, $\Delta\phi=0.01°$, and $\phi=488$ nm, $\Delta f=10.7$ optical wavelengths. Given typical optical tolerances, $\Delta f$ is difficult to maintain for reasonably sized memories (N greater than approximately 3), unless provision is made to adjust or minimize $\Delta f$ each time a different storage module is addressed. Focusing lens $FL_1$ performs this adjusting function.

As shown in FIG. 1, the second (n=2) holographic storage module 12 contained within an N-module memory (n=1, 2, . . . , N) has been selected and may be precisely addressed by adjusting the position of focusing lens $FL_1$. As discussed above, the second holographic storage module 12 is selected by adjusting polarization rotator $PR_2$ so as to cause the reference beam to reflect from polarizing beam splitter PBS2 toward the second storage module 12.

Referring now to FIG. 2, the combination of spherical lens $CL_2$ and Cube Beam Splitter Array $CBSA_2$ generates "M" reference beam waists within Storage Module 2, where M is the number of elements of $CBSA_2$ (M=4 in FIG. 1). For a given L (length of one of the holographic storage modules) and M, the focal length of $CL_n$ (which is nominally set equal to $d_1 + d_2$ for all n) is selected such that the greatest distance, $1_{MAX}$, between Reference Plane $RP_2$ and Beam Waist "1" or "M" is less than or equal to $\Delta f \cdot \lambda$.

For typical, i.e., economical, optical elements, $\Delta f$ cannot be maintained within tolerance for all storage modules simultaneously, if all elements of the module addressing optics are fixed in position. By attaching Focusing Lens $FL_1$ to a translation stage, however, $\Delta f$ may be minimized in real time in order to address precisely any one of the N modules shown in FIG. 1.

Different holograms within a given storage module are individually addressed by adjusting the angle at which the collimated laser beam is incident on $FL_1$. Real-time, closed-loop adjustment of the position of $FL_1$ in the $\pm Y$ direction, is achieved by monitoring a portion of an object beam (Object Beam (2) in the example shown in FIG. 1) addressed by the incident reference beam (Reference Beam Array (2) in the example shown in FIG. 1). The object beam is preferably monitored via hologram monitor 43. Thus, by maximizing the intensity of a portion of said object beam, $\Delta f$ is minimized by servoing the translation stage upon which $FL_1$ is attached. Such servoing is preferably effected via servo control 45. By this means all holograms within all storage modules may be optimized in real-time.

Coarse minimization of $\Delta f$ for each module may be achieved by pre-storing translation stage positions within a digital memory 47.

It is understood that the exemplary reference beam auto-focus apparatus for modularized volume-holographic memory shown herein and shown in the drawings represents only a presently preferred embodiment of the present invention. Indeed, various modifications and additions may be made to such embodiment without departing from the spirit and scope of the invention. For example, as those skilled in the art will appreciate, various different optical components may be substituted for those illustrated and described. Thus, various lenses, mirrors, etc., may be incorporated, depending upon the particular geometry of the system.

Thus, these and other modifications and additions may be obvious to those skilled in the art and may be adapted for use in a variety of different applications.

What is claimed is:

1. A method for addressing a hologram stored in a storage media, said method comprising the steps of:
    a) directing a reference beam to a linear array of beam splitters;
    b) each beam splitter of the array directing a portion of the reference beam to a different location proximate a reference plane within a common storage medium;
    c) focusing the reference beam so as to obtain a substantially flat wavefront within the reference plane of the storage medium; and
    d) said reference beam reading a hologram stored within the storage medium.

2. The method as recited in claim 1, wherein the step of directing a reference beam to an array of beam splitters comprises directing a reference beam to one of a plurality of arrays of beam splitters, each array of beam splitters directing the reference beam to a dedicated storage medium, thus facilitating addressing of holograms stored in a plurality of separate storage media.

3. The method as recited in claim 1 wherein said reference beam is focused via a lens disposed upon a translation stage.

4. The method as recited in claim 3 further comprising the step of monitoring the hologram beam read-out and utilizing servo control of the translation stage to effect collimation of the reference beam within the storage medium.

5. The method as recited in claim 1 wherein the degree of flatness ($\Delta f$), in wavelengths, is determined by the angular separation between adjacent angle-multiplexed holograms, according to the formula:

$$\Delta f = (L/\lambda) \tan \Delta \phi$$

where L is the length of the storage medium, $\lambda$ is the wavelength of the reference beam, and $\Delta \phi$ is the angular separation between adjacent angle multiplexed holograms.

6. The method as recited in claim 1 wherein the step of directing a reference beam to a desired one of a plurality of separate storage media comprises aligning polarization of the reference beam such that the reference beam is reflected by a polarizing beam splitter toward the selected storage medium, the reference beam being transmitted by the beam splitter when a different storage medium is selected.

7. The method as recited in claim 1, comprising the further step of varying an angle of the reference beam so as to address a selected hologram stored within the storage medium, the selected hologram being read-out as a result of such addressing.

8. The method as recited in claim 7, wherein the reference beam is focused such that each beam splitter of the beam splitter array forms a reference beam waist within the storage medium such that a distance from each reference beam waist to a reference beam plane is less than or equal to $\Delta f \cdot \lambda$.

* * * * *